United States Patent [19]

Liang

[11] Patent Number: 5,378,924
[45] Date of Patent: Jan. 3, 1995

[54] APPARATUS FOR THERMALLY COUPLING A HEAT SINK TO A LEAD FRAME

[75] Inventor: Louis H. Liang, Los Altos, Calif.

[73] Assignee: VLSI Technology, Inc., San Jose, Calif.

[21] Appl. No.: 96,335

[22] Filed: Jul. 23, 1993

Related U.S. Application Data

[63] Continuation-in-part of Ser. No. 943,272, Sep. 10, 1992, abandoned.

[51] Int. Cl.⁶ .................. H01L 23/48; H01L 29/44; H01L 29/52; H01L 29/60
[52] U.S. Cl. .................. 257/675; 257/670; 257/676; 257/706; 257/718; 257/719; 257/727; 361/688; 361/714; 361/723
[58] Field of Search .............. 257/718, 719, 706, 707, 257/796, 727, 675, 670, 676; 361/723, 688, 714, 707, 704

[56] References Cited

U.S. PATENT DOCUMENTS

| | | | |
|---|---|---|---|
| 3,611,046 | 10/1971 | Covert | 317/100 |
| 3,930,114 | 12/1975 | Hodge | 174/52 |
| 4,092,697 | 5/1978 | Spaight | 361/688 |
| 4,812,949 | 3/1989 | Fontan et al. | 257/675 |
| 4,878,108 | 10/1989 | Phelps, Jr. et al. | 257/796 |
| 4,878,846 | 1/1989 | Schroeder | 257/727 |
| 5,091,341 | 2/1992 | Asada et al. | 437/212 |
| 5,109,317 | 4/1992 | Miyamoto et al. | 361/386 |
| 5,200,809 | 4/1993 | Kwon | 257/707 |
| 5,218,215 | 6/1993 | Liang et al. | 257/712 |

FOREIGN PATENT DOCUMENTS

| | | | |
|---|---|---|---|
| 3513221 | 10/1986 | Germany | 257/718 |
| 60-46037 | 3/1985 | Japan | 257/718 |

OTHER PUBLICATIONS

IBM, TDB, vol. 31, No. 4, Sep. 1988 Thermally Efficient and Secure Module Package with Components Adaptable, pp. 377-379.
IBM, TDB, vol. 14, No. 1, Jun. 1971 External Module Heat Sink Fastened to Board, p. 182.
IBM, TDB, vol. 21, No. 4, Sep. 1978 Module with Internal Elements for Reducing Thermal Resistance, pp. 1473-1474.
RD, Oct. 1990, No. 318 Spring-loaded Heat Sinks for VLSI Packages.

Primary Examiner—Sara W. Crane
Assistant Examiner—T. M. Arroyo
Attorney, Agent, or Firm—Patrick T. King; John P. Wagner

[57] ABSTRACT

A molded plastic package for an integrated-circuit die includes a lead frame having inwardly extending tie bars and a central die-attach paddle. One side of the die-attach paddle has an integrated-circuit die fixed thereto. A heat sink member is resiliently fixed to the other side of the die-attach paddle using a layer of viscous thermal grease between the heat sink member and the other side of the die-attach paddle. At least one holes is formed through a portion of the lead frame and is engaged by a corresponding elongated stud on the heat sink. The elongated stud extends upwardly through the layer of thermal grease through the holes in the lead frame and terminates at the top of the molded plastic package. By extending to the top of the plastic package, the elongated stud firmly holds the heat sink against the bottom of the mold cavity during the encapsulation process. As a result, the bottom surface of the heat sink remains exposed after the encapsulation process.

38 Claims, 3 Drawing Sheets

APPARATUS FOR THERMALLY COUPLING A HEAT SINK TO A LEAD FRAME

CROSS REFERENCE TO RELATED APPLICATION

This is a continuation-in-part of co-pending patent application Ser. No. 07/943,272 filed Sep. 10, 1992, now abandoned.

BACKGROUND OF THE INVENTION

1. Field of the Invention

This invention relates to packaging techniques for integrated circuits and, more particularly, to molded-plastic packages in which a heat sink is included.

2. Prior Art

A heat sink is attached directly to a die-attach paddle of a lead frame using one of a number of conventional attachment techniques, including welding, soldering, brazing, and adhesive-bonding.

An example of an integrated-circuit package which uses a heat sink is shown in a U.S. Pat. No. 3,930,114, invented by R. Hodge and granted Dec. 30, 1975. The Hodge reference shows an integrated-circuit chip fixedly secured to the upper surface of a die-attachment pad. An elongated copper heat sink is brazed to the under side of the die-attachment pad. The Hodge device provides a pair of L-shaped flexible fingers which forces the heat sink against the lower surface of a mold. In so doing, the lower, exposed surface of the heat sink is pressed against the surface of the mold and no molten plastic is able to flow between the lower surface of the mold and the lower surface of the heat sink. This eliminates the need to grind away hardened encapsulant material to expose the surface of the copper heat sink. The L-shaped flexible fingers of the Hodge reference extend upwardly from the heat sink towards the top of the mold cavity through spaces present between bonding fingers of the lead frame. However, the spaces present between the bonding fingers of fine lead pitch and high pin count lead frames are not large enough to accommodate the insertion of such L-shaped flexible fingers therebetween.

Furthermore, using conventional attachment techniques to rigidly attach a heat sink to a lead frame for an integrated circuit, as shown in the Hodge reference, may raise several problems, particularly if dissimilar materials are used. One of these problems is the dissimilarity in the thermal coefficients of expansion (TCE) for the different materials used in the lead frame, the heat sink, and sometimes the attachment material. These differences in the thermal coefficients of expansion are important because of the possible reliability problems caused when stresses are built up in a package assembly at various temperature due to the differences in the TCE's. Restrictions on selection of material to avoid dissimilarities in TCE's may preclude using the best materials possible for particular functions. For example, copper or a copper alloy is a good material for a lead frame and aluminum or an aluminum alloy is a good material for a heat sink. The TCE's (in units of $10^{-7}$/degree Centigrade) for various materials are: copper: 170; Cu/W alloy: 70; Cu/Mo: 72; and aluminum: 230.

Another problem is the extra cost incurred in using special tooling and special materials for a package with a heat sink, as compared to the standard cost incurred in using a standard package without heat sinks. For example, a package mold designed for use with an aluminum alloy lead frame can not be used with copper lead frames. High tensile strength copper is typically more expensive than Al 42.

Another cost item is that heat sinks must be prefabricated and attached to the lead frame at the lead frame manufacturing site. This increases the need for additional inventories of lead frames with heat sinks and lead frames without heat sinks at an assembly sites to accommodate needs for both types of lead frames. This also requires that additional raw materials be stocked at a lead frame manufacturing sites.

Various types of drop-in or floating heatsink designs have addressed the problems associated with the inventory problems and problems associated with dissimilarities in the thermal coefficients of expansion (TCE) for the different materials. These drop-in heatsinks sometimes fail to provide positive thermal coupling between a lead frame and a heatsink. Too large of a gap between the drop-in heatsink and the lead frame allows molding compound to fill the space between the lead frame and the heatsink. Because the molding compound is a thermal insulator, the thermal efficiency of the package can be affected. Too small of a gap between the drop-in heatsink and the lead frame can create a trapped air space. The trapped air space is also a thermal insulator and can be a source of unreliability because moisture tends to gather in the trapped air pocket. An additional concern with a drop-in or floating heatsink design is referred to as pad tilting. Molding compound injected into a mold cavity at a high velocity can differentially fill the gap between the heatsink and the lead frame. This creates pad tilt which results in a reliability problem for plastic quad packages with high pin counts.

Thus, the need has arisen for an economical integrated-circuit packaging technique which provides a standardized lead frame which can be mechanically isolated from an optionally used heat sink and which can be used with fine lead pitch and high pin count lead frames.

SUMMARY OF THE INVENTION

It is therefore an object of the invention to provide apparatus and a method for thermally coupling a lead frame for an integrated-circuit die to a heat sink, at the option of a user. Another object of the invention is to provide a flexible system which optionally provides for attachment of a heat sink to a metric quad flat pack (MQFP) package configuration such that the heat sink can be optionally added at the package assembly stage and such that mismatch of the TCE's of the lead frame and the heat sink are not critical.

In accordance with this and other objects of the invention, a molded plastic package assembly is provided according to the invention. A lead frame has a central die-attach paddle, one side of which is adapted to having an integrated-circuit die fixed thereto. A heat sink member is positioned adjacent to the other side of, and is resiliently fixed to, the other side of the die-attach paddle using a layer of viscous thermal grease located therebetween.

One or more locating holes are formed through the leadframe. Respective one or more elongated studs which are fixed to the heat sink extend upwardly through the layer of thermal grease and through the locating holes. The holes are positioned on the leadframe such that the elongated studs do not interfere with and are not obstructed by bonding wires or bonding fingers of the lead frame. The elongated studs extend upwardly and contact the top surface of the mold. In so doing, bottom surface of the heat sink is firmly held against the bottom of the mold. As a result, the bottom surface of the heat sink remains exposed after the encapsulation process. In one embodiment of the present claimed invention, the holes are formed in the lead frame such that the lead frame can be clipped to the elongated studs. By clipping or fixedly attaching the lead frame to the elongated studs, the present invention eliminates reliability problems associated with pad tilting.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
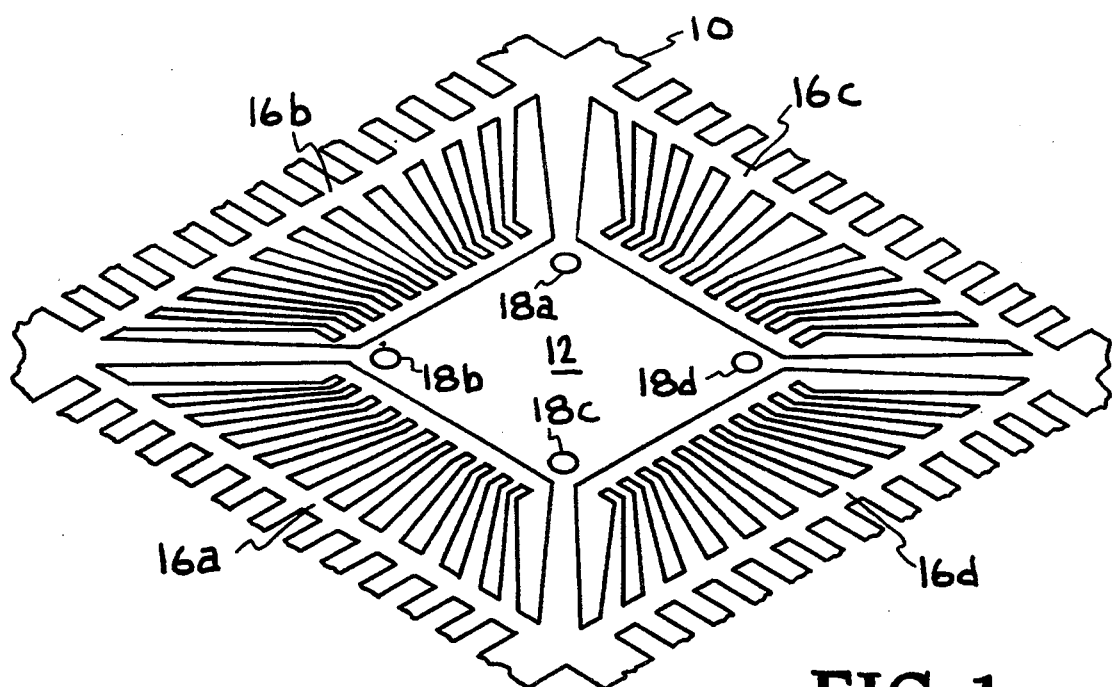
FIG. 1 is an isometric view of a lead frame prior to assembly and trim operations, where the lead frame includes locating holes formed at the corners of the die-attach paddle for receiving elongated studs in accordance with the present invention.

With reference now to FIG. 1, a lead frame 10, used according to the invention, prior to assembly and trim operations is illustrated. The lead frame 10 is formed from a thin strip of alloy 42 material. A centrally-located die-attach paddle 12 is provided for attachment of an integrated-circuit die, not shown in FIG. 1, to the top side thereof. A number of radially-extending leads, typically shown as 14, are mechanically attached together by sections 16a–16d of a dambar. The sections 16a–16d are removed after the lead frame and the attached integrated-circuit die are encapsulated in a molded package. The leads have bonding fingers 15 located adjacent to the edges of the die-attach paddle 12. Bonding wires are connected between bonding pads formed on the integrated-circuit die and the bonding fingers on the ends of the leads 14 prior to encapsulation. Locating holes 18a–18d are formed through the corners of the die-attach paddle for receiving locating studs of a floating heat sink member.

Figure 2:
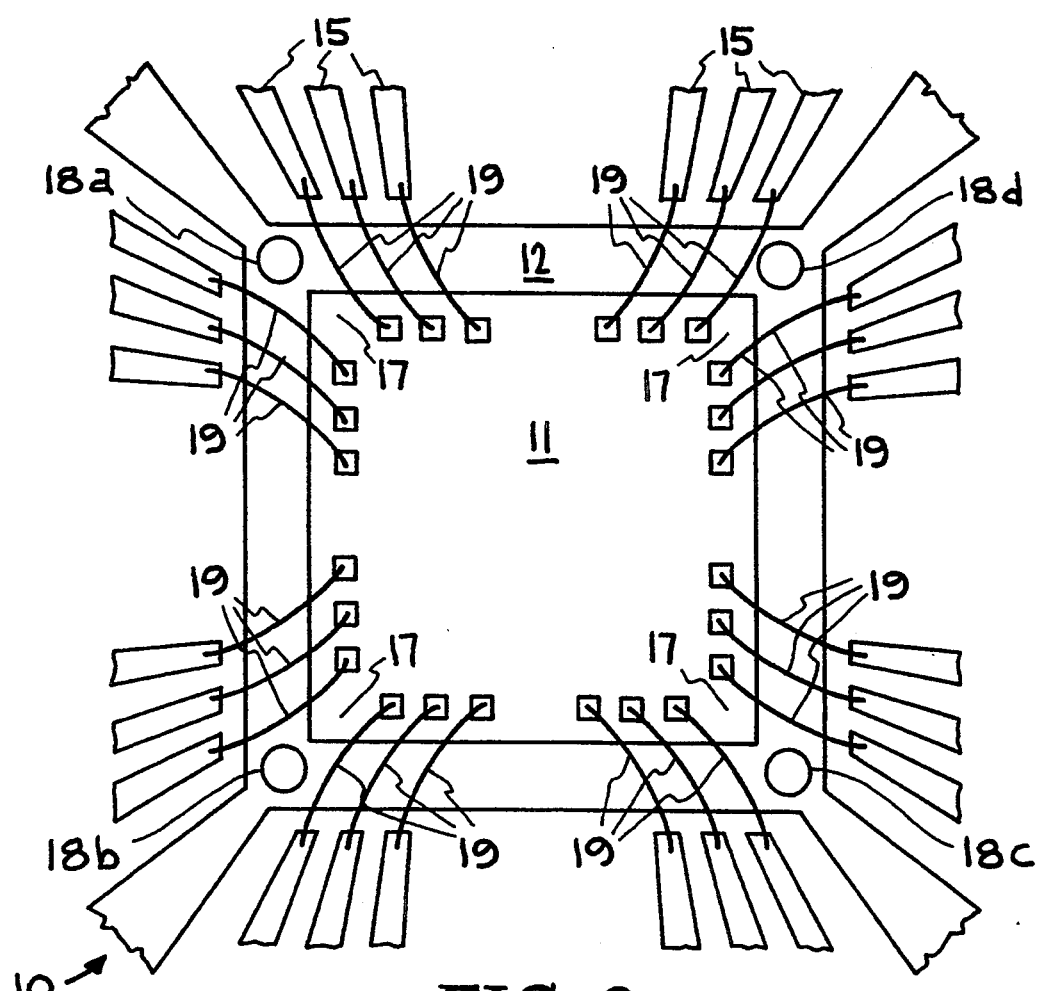
FIG. 2 is a plan view of an integrated circuit die attached to the die-attach paddle of the lead frame FIG. 1 in accordance with the present invention.

With reference now to FIG. 2, an integrated circuit die 11 having a plurality of bonding pads 13 formed thereon is shown attached to the die-attach paddle 12 of the lead frame 10 of FIG. 1. As shown in FIG. 2, due to the electrical design of the integrated-circuit die 11, no bonding pads 13 are present in the corner regions 17 of the integrated circuit die 11. The corner regions 17 are therefore referred to as "dead spaces." The locating holes 18a–18d are arranged in the corner of the die-attach paddle 11, such that the holes 18a–18d are adjacent to the dead spaces 17 on the integrated-circuit die 11. As a result, the elongated studs, not shown, which extend upwardly through the locating holes 18a–18d are not obstructed by the bonding wires, typically shown as 19, which electrically connect the bonding pads 13 to the bonding fingers 15 of the lead frame 10. Also, the elongated studs do not have to pass between leads of the lead frame as in the prior art.

Figure 3:
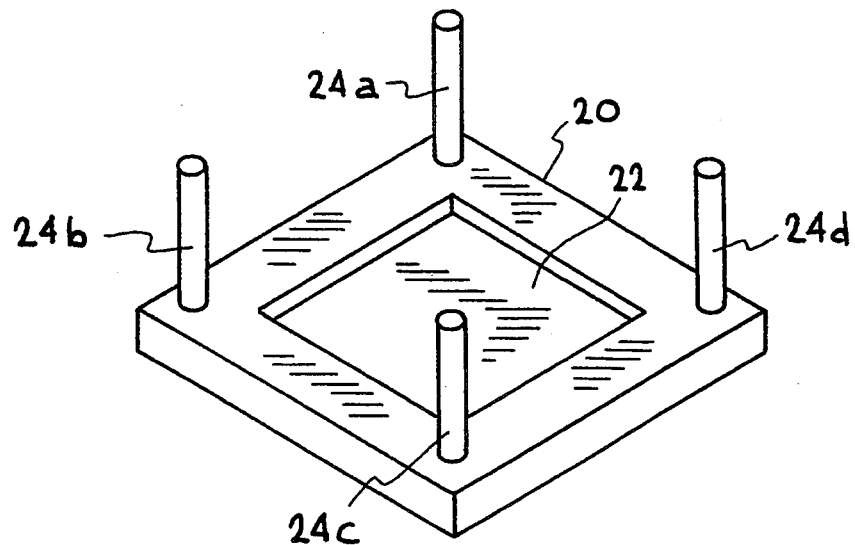
FIG. 3 is an isometric view of a heat sink member having elongated studs formed at each corner and having a central recessed area formed therein for containing a viscous thermal grease for attaching the heat sink member to one side of the die-attach paddle in accordance with the present invention.

Referring now to FIG. 3, a floating heat sink member 20 which is formed of a conductive material such as copper is shown. Although a copper heat sink member 20 is used in the present embodiment of the invention, other materials such as, for example, silicon, or ceramic materials such as, for example, anodized aluminum, beryllium oxide or alumina oxide may be used as the heat sink material. The floating heat sink member 20 is shaped as a rectangular plate having a shallow, centrally-located recessed area 22 formed into one side, as shown in FIG. 3. The cavity 22 is intended to contain a viscous thermal grease which is used for resiliently fixing the heat sink 20 to the back side of the die-attach paddle 12. Although a rectangular heat sink 20 having a cavity formed therein is used in the present embodiment, the claimed invention is also well-suited to differently configured substrates. Extending upwardly from each corner of the heat sink member are elongated locating studs 24a–24d fixed into holes located at each corner of the heat sink 20. The elongated studs 24a–24d, which are fixed to the heat sink 20, serve as means for coarsely positioning the heat sink 20 with respect to the back side of the die-attach paddle 12.

With reference still to FIG. 3, the elongated studs 24a–24d also extend upwardly a sufficient distance such that the elongated studs 24a–24d contact the top of the mold, not shown. In so doing, the elongated studs 24a–24d hold the bottom surface of the heat sink 20 firmly against the bottom of the mold.

Figure 4:
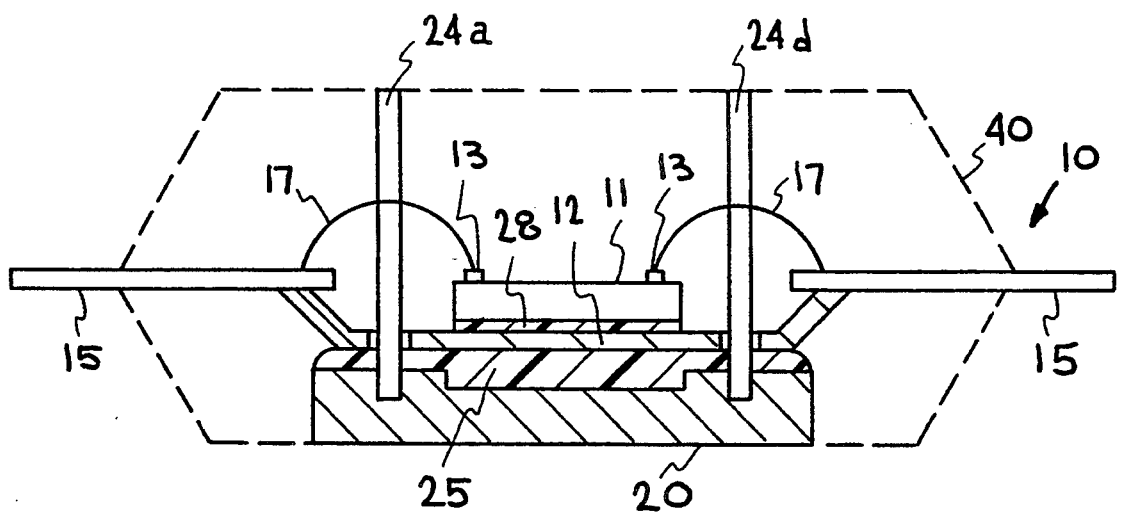
FIG. 4 is a sectional, elevation view of a package assembly showing a heat sink with attached elongated studs located adjacent to the backside of a die-attach paddle using a viscous thermal grease in accordance with the present invention.

Referring now to FIG. 4, the heat sink 20 is shown fixed in position adjacent to the back side of the die-attach paddle 12 using a layer 25 of a highly viscous thermal grease. The elongated studs 24a and 24d contact the top of the mold cavity 40, thereby holding the bottom surface of the heat sink 20 against the bottom of the mold 40. Thus, when molten plastic molding compound is injected into the mold cavity, no molten plastic material is able to flow under the heat sink 20. As a result, the bottom of the heat sink 20 remains exposed after the encapsulation process, allowing for more effective dissipation of heat. Furthermore, by preventing the flow of molding compound onto the bottom surface of the heat sink 20, the present claimed invention eliminates the need to remove hardened plastic molding compound from the bottom of the heat sink 20.

With reference still to FIG. 4, the highly viscous layer of thermal grease 25 serves as a means for resiliently fixing the heat sink member 20 to the back side of the die-attach paddle 12. The integrated-circuit die 11 is shown fixed to the top side of the die-attach paddle 12 with a layer 28 of die-attach adhesive material. The layer of highly viscous thermal grease 25 is comprised of a material such as, for example, a diamond filled silicone material, or a material which after curing remains flexible. The layer 25 of highly viscous thermal grease provides a thermal path for heat from the integrated-circuit die 11 to the heat sink 20. Because the heat sink 20 is not rigidly attached to the die-attach paddle 12, it can be thought of as mechanically floating with respect to the lead frame. In this manner, the various stress forces produced by differences in the thermal coefficients of expansion between the lead frame and the heat sink 20 are absorbed by the highly viscous layer of thermal grease 25. As a result, the reliability problems associated with the use of heat sinks and lead frames having differing thermal coefficients of expansion is eliminated by the present invention. Bonding wires 17 are also shown typically connected between bonding pads 13 on the integrated-circuit die 11 and the inner ends of bonding fingers 15 of the lead frame 10.

Figure 5:
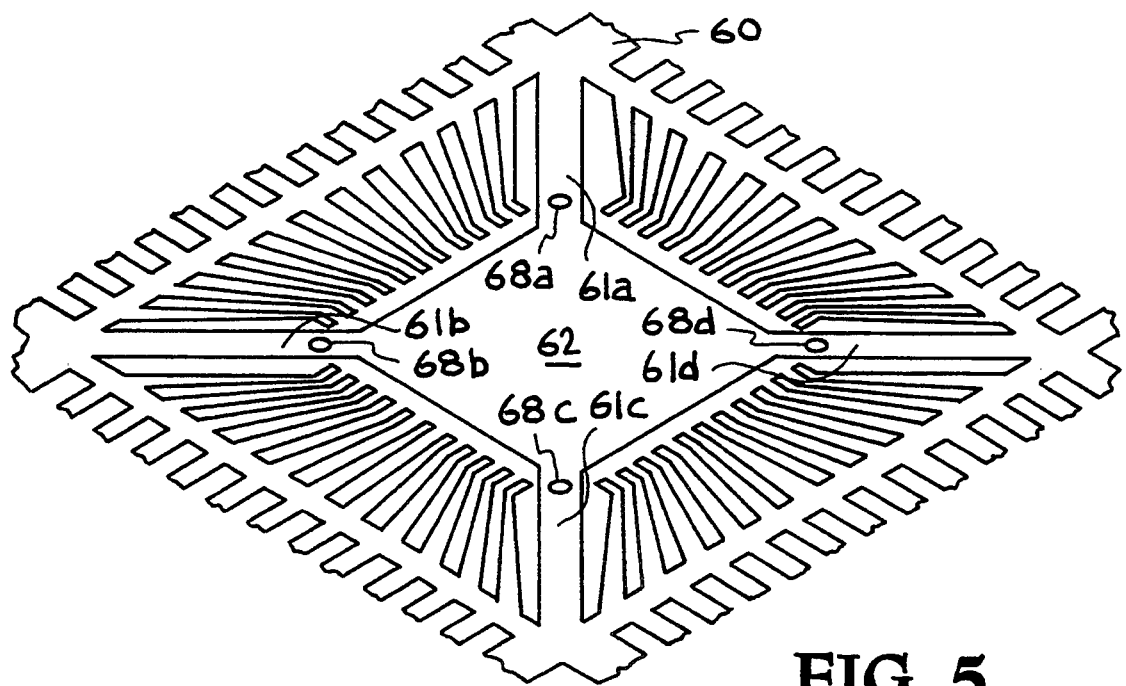
FIG. 5 shows a lead frame with locating holes positioned on the tie-bars near the corners of the die-attach paddle in accordance with the present invention.

With reference now to FIG. 5, a lead frame 60 having locating holes 68a–68d formed into the tie bars 61a–61d of the lead frame 60 is shown. By positioning the locating holes 68a–68d on the tie bars 61a–61d and away from the central area of the die-attach paddle 62, the size of the integrated-circuit die, to be attached thereto, is not limited by the presence of studs at the corners of the die-attach paddle 62. Additionally, by placing the locating holes on the tie bars 61a–61d of the lead frame 60, the elongated locating studs, not shown, which extend therethrough, are not obstructed by bonding wires or leads of the lead frame as in the prior art.

Figure 6:
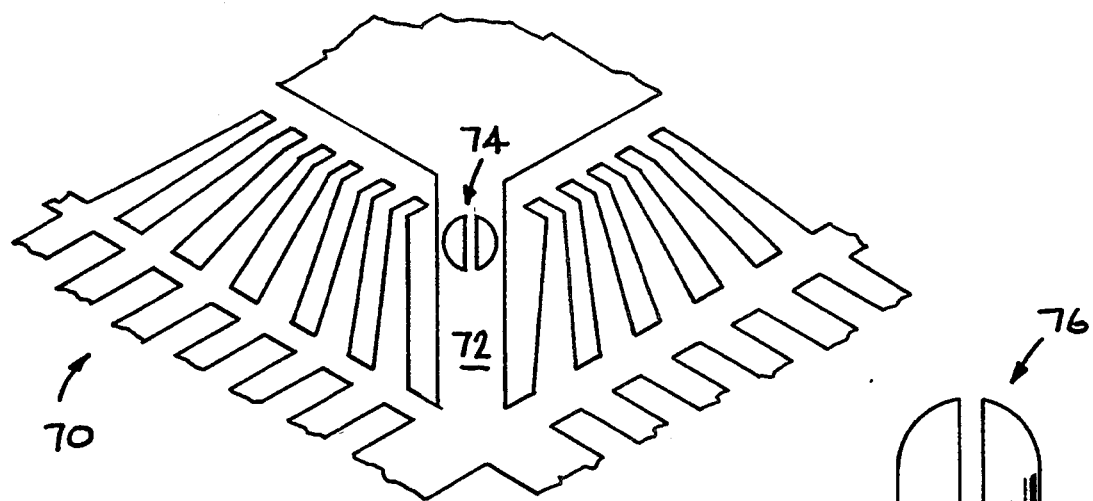
FIG. 6 is an enlarged view of a lead frame with semicircular locating holes formed into the tie bars near the corners of the die-attach paddle in accordance with the present invention.

Referring now to FIG. 6, a portion of lead frame 70 is shown having a locating hole 74 formed through a tie bar 72 thereof. The locating hole 74 is formed of two semi-circular openings. By forming the locating hole 74 in such a manner, an elongated stud having a corresponding slot formed into the top surface thereof may be inserted through the opening and clipped to the tie bar 72 of the lead frame 70.

Figure 7:
FIG. 7 is a side view of an elongated stud having a slot formed in the top surface thereof to facilitate clipping of the elongated stud to the lead frame in accordance with the present invention.

FIG. 7 shows an example of an elongated stud 76 having a slot formed into the top surface thereof. In order to clip the elongated stud 76 of FIG. 7 to the tie bar 72 of the lead frame 70 of FIG. 6, after the elongated stud 76 has been inserted through the locating hole 74 of FIG. 6, the ends of the elongated stud 76 are "pinched" together. In so doing, the portion of the tie bar 72, of FIG. 6, present between the two semi-circular openings is held within the slot formed into the elongated stud 76. Thus, the position of the lead frame within the mold cavity can be firmly maintained by clipping the elongated stud 76 to the lead frame.

Referring again to FIG. 6, by clipping the elongated studs to the lead frame 70, an important advantage is realized. In addition to insuring that the heat sink is held firmly against the bottom of the mold cavity, the elongated studs also firmly maintain the position of the lead frame within the mold cavity during the encapsulation process. As a result, the present invention also helps to reduce problems associated with pad tilting during the injection of the molten plastic compound into the mold cavity. Although the elongated stud is clipped to the tie bar portion of the lead frame in the present embodiment, the present invention is also well suited to having the elongated studs clipped to other portions of the lead frame such as, for example, the die-attach paddle of the lead frame. Additionally, although the locating holes and corresponding elongated studs of the present embodiment were shaped as shown in FIGS. 6 and 7, alternate configurations for the locating holes and elongated studs are also well suited to the present claimed invention.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A molded plastic package for an integrated-circuit die, comprising:

a molded plastic body, a lead frame having a die-attach paddle and inwardly-extending tie bars, said inwardly-extending tie bars disposed at the corners of said lead frame and coupled to said die-attach paddle such that said die-attach paddle is disposed in the center of said lead frame, said die-attach paddle having first and second surfaces, an integrated-circuit die attached to said first surface of said die-attach paddle, a heat sink member having a top surface and a bottom surface, said heat sink member disposed such that said top surface of said heat sink member is disposed adjacent to said second surface of said die-attach paddle, at least a portion of said heat sink member encapsulated by and directly contacting said molded plastic body, a layer of viscous thermal grease disposed between said top surface of said heat sink member and said second surface of said die-attach paddle, at least one elongated stud fixed to said heat sink, said at least one elongated stud disposed extending upwardly from said top surface of said heat sink member through said layer of said viscous thermal grease and said lead frame, said at least one elongated stud encapsulated by and directly contacting said molded plastic body.

2. The package of claim 1 wherein said at least one elongated stud extends upwardly to the top of said molded plastic package.

3. The package of claim 1 wherein said at least one elongated stud extends upwardly through respective at least one hole formed in said die-attach paddle of said lead frame.

4. The package of claim 3 wherein said at least one hole formed in said die-attach paddle is disposed proximate to the corners of said integrated circuit die.

5. The package of claim 1 wherein said at least one elongated stud extends upwardly through respective at least one hole formed in at least one tie bar of said lead frame.

6. The package of claim 5 wherein said at least one elongated stud is fixedly attached to said respective at least one tie bar of said lead frame.

7. The package of claim 3 wherein said at least one elongated stud is fixedly attached to said die-attach paddle of said lead frame.

8. The package of claim 1 wherein said heat sink member is formed of a ceramic material.

9. The package of claim 1 wherein said heat sink member is formed of a ceramic material selected from the group comprising alumina nitride, beryllium oxide, and anodized aluminum.

10. The package of claim 1 wherein said heat sink member is formed of silicon.

11. A molded plastic package for an integrated-circuit die, comprising:
a molded plastic body,
a lead frame having a die-attach paddle and inwardly-extending tie bars, said inwardly-extending tie bars disposed at the corners of said lead frame and coupled to said die-attach paddle such that said die-attach paddle is disposed in the center of said lead frame, said die-attach paddle having first and second surfaces,
an integrated-circuit die attached to said first surface of said die-attach paddle,
a heat sink member having a top surface and a bottom surface, said heat sink member disposed such that said top surface of said heat sink member is disposed adjacent to said second surface of said die-attach paddle, at least a portion of said heat sink member encapsulated by and directly contacting said molded plastic body,
a layer of viscous thermal grease disposed between said top surface of said heat sink member and said second surface of said die-attach paddle,
at least one elongated stud fixed to said heat sink, said at least one elongated stud disposed extending upwardly from said top surface of said heat sink member through said layer of said viscous thermal grease and said lead frame, said at least one elongated stud terminating at the top of said molded plastic package, said at least one elongated stud encapsulated by and directly contacting said molded plastic body.

12. The package of claim 11 wherein said at least one elongated stud extends upwardly through respective at least one hole formed in said die-attach paddle of said lead frame.

13. The package of claim 12 wherein said at least one hole formed in said die-attach paddle is disposed proximate to the corners of said integrated circuit die.

14. The package of claim 11 wherein said at least one elongated stud extends upwardly through respective at least one hole formed in at least one tie bar of said lead frame.

15. The package of claim 14 wherein said at least one elongated stud is fixedly attached to said respective at least one tie bar of said lead frame.

16. The package of claim 12 wherein said at least one elongated stud is fixedly attached to said die-attach paddle of said lead frame.

17. The package of claim 11 wherein said heat sink member is formed of a ceramic material.

18. The package of claim 11 wherein said heat sink member is formed of a ceramic material selected from the group comprising alumina nitride, beryllium oxide, and anodized aluminum.

19. The package of claim 11 wherein said heat sink member is formed of silicon.

20. A molded plastic package for an integrated-circuit die, comprising:
a molded plastic body,
a lead frame having a die-attach paddle and inwardly-extending tie bars, said inwardly-extending tie bars disposed at the corners of said lead frame and coupled to said die-attach paddle such that said die-attach paddle is disposed in the center of said lead frame, said die-attach paddle having first and second surfaces,
an integrated-circuit die attached to said first surface of said die-attach paddle,
a silicon heat sink member having a top surface and a bottom surface, said heat sink member disposed such that said top surface of said silicon heat sink member is disposed adjacent to said second surface of said die-attach paddle, at
at least one elongated stud fixed to said silicon heat sink member, said at least one elongated stud disposed extending upwardly from said top least a portion of said heat sink member encapsulated by and directly contacting said molded plastic body,
a layer of viscous thermal grease disposed between said top surface of said silicon heat sink member and said second surface of said die-attach paddle,
at least one elongated stud fixed to said silicon heat sink member, said at least one elongated stud disposed extending upwardly from said top surface of said silicon heat sink member through said layer of said viscous thermal grease and said lead frame, said at least one elongated stud encapsulated by and directly contacting said molded plastic body.

21. The package of claim 20 wherein said at least one elongated stud extends upwardly to the top of said molded plastic package.

22. The package of claim 20 wherein said at least one elongated stud extends upwardly through respective at least one hole formed in said die-attach paddle of said lead frame.

23. The package of claim 22 wherein said at least one hole formed in said die-attach paddle is disposed proximate to the corners of said integrated circuit die.

24. The package of claim 20 wherein said at least one elongated stud extends upwardly through respective at least one hole formed in at least one tie bar of said lead frame.

25. The package of claim 24 wherein said at least one elongated stud is fixedly attached to said respective at least one tie bar of said lead frame.

26. The package of claim 22 wherein said at least one elongated stud is fixedly attached to said die-attach paddle of said lead frame.

27. The package of claim 1 wherein said heat sink member has a recessed area centrally located in said top surface thereof for containing said layer of viscous thermal grease between said top surface of said heat sink member and said second surface of said die-attach paddle.

28. The package of claim 11 wherein said heat sink member has a recessed area centrally located in said top surface thereof for containing said layer of viscous thermal grease between said top surface of said heat sink member and said second surface of said die-attach paddle.

29. The package of claim 20 wherein said heat sink member has a recessed area centrally located in said top surface thereof for containing said layer of viscous thermal grease between said top surface of said heat sink member and said second surface of said die-attach paddle.

30. A molded plastic package for an integrated-circuit die, comprising:
a molded plastic body,
a lead frame having a die-attach paddle and inwardly-extending tie bars, said inwardly-extending tie bars disposed at the corners of said lead frame and coupled to said die-attach paddle such that said die-attach paddle is disposed in the center of said lead frame, said die-attach paddle having first and second surfaces,
an integrated-circuit die attached to said first surface of said die-attach paddle,
a heat sink member having a top surface and a bottom surface, said heat sink member disposed such that said top surface of said heat sink member is disposed adjacent to said second surface of said die-attach paddle, said heat sink member having a recessed area centrally located in said top surface thereof for containing a supply of viscous thermal grease between said top surface of said heat sink member and said second surface of said die-attach paddle, at least a portion of said heat sink member encapsulated by and directly contacting said molded plastic body,
a layer of viscous thermal grease disposed between said top surface of said heat sink member and said second surface of said die-attach paddle,
at least one elongated stud fixed to said heat sink, said at least one elongated stud disposed extending upwardly from said top surface of said heat sink member through said layer of said viscous thermal grease and said lead frame, said at least one elongated stud terminating at the top of said molded plastic package, said at least one elongated stud encapsulated by and directly contacting said molded plastic body.

31. The package of claim 30 wherein said at least one elongated stud extends upwardly through respective at least one hole formed in said die-attach paddle of said lead frame.

32. The package of claim 31 wherein said at least one hole formed in said die-attach paddle is disposed proximate to the corners of said integrated circuit die.

33. The package of claim 30 wherein said at least one elongated stud extends upwardly through respective at least one hole formed in at least one tie bar of said lead frame.

34. The package of claim 33 wherein said at least one elongated stud is fixedly attached to said respective at least one tie bar of said lead frame.

35. The package of claim 31 wherein said at least one elongated stud is fixedly attached to said die-attach paddle of said lead frame.

36. The package of claim 30 wherein said heat sink member is formed of a ceramic material.

37. The package of claim 30 wherein said heat sink member is formed of a ceramic material selected from the group comprising alumina nitride, beryllium oxide, and anodized aluminum.

38. The package of claim 30 wherein said heat sink member is formed of silicon.

* * * * *